United States Patent [19]

Wong

[11] 4,296,454
[45] Oct. 20, 1981

[54] MOLDED CIRCUIT RETAINING ENCLOSURE WITH A RECEPTACLE MEANS FOR SECURING INDIVIDUAL CIRCUIT COMPONENTS

[75] Inventor: William H. Wong, Morristown, N.J.

[73] Assignee: Bell Telephone Laboratories, Incorporated, Murray Hill, N.J.

[21] Appl. No.: 86,724

[22] Filed: Oct. 22, 1979

[51] Int. Cl.³ .............................................. H05K 7/12
[52] U.S. Cl. ................................. 361/380; 174/52 R; 361/386; 361/331; 361/392; 220/4 E
[58] Field of Search ............. 174/52 R; 220/4 B, 4 E, 220/3.92, 3.94; 361/331, 332, 334, 356, 357, 380, 386, 388, 392, 417–420, 422, 423, 427

[56] References Cited

U.S. PATENT DOCUMENTS

| | | | |
|---|---|---|---|
| 3,243,037 | 3/1966 | Luertzing | 206/1 |
| 3,652,974 | 3/1972 | Tems | 339/36 |
| 3,717,245 | 2/1973 | Brander | 206/65 R |
| 3,721,865 | 3/1973 | Rademaker | 361/380 |
| 3,964,808 | 6/1976 | Suzuki | 312/8 |
| 4,032,707 | 6/1977 | Trenany | 174/52 R |
| 4,049,357 | 9/1977 | Hamisch, Jr. | 220/4 E |
| 4,081,629 | 3/1978 | Benesh | 179/178 |
| 4,126,369 | 11/1978 | Rapata | 174/52 R |

Primary Examiner—Gerald P. Tolin
Attorney, Agent, or Firm—Alfred G. Steinmetz

[57] ABSTRACT

A circuit support enclosure has drop-in receptacles in a base chassis structure for individual circuit components. After circuit components are placed in the drop-in receptacles, a retaining chassis structure is mated with the base chassis structure. The base chassis structure includes two tongs which have pawls which interlock with slots in the retaining chassis structure. The retaining chassis structure includes bifurcated retainers and clamp nodules that clamp the electrical components into their respective drop-in receptacles in the base chassis structure.

4 Claims, 8 Drawing Figures

MOLDED CIRCUIT RETAINING ENCLOSURE WITH A RECEPTACLE MEANS FOR SECURING INDIVIDUAL CIRCUIT COMPONENTS

FIELD OF THE INVENTION

This invention is concerned with molded circuit support structures and is particularly concerned with a two-piece molded circuit support enclosure with drop-in fit receptacles for electrical components in one structure and a second securing structure mating to the first structure.

BACKGROUND OF THE INVENTION

Conventional circuit chassis arrangements for electrical components normally comprise a separate base chassis structure, usually a metal plate to which the electrical components are secured by means of clip-type or screw-type attachments. Sometimes the basic support structure includes a printed circuit board to supply the wiring to which small components are plugged in and large components are mounted on a separate structural chassis member.

Large components usually comprise inductors, transformers, can capacitors and other various electrical devices of significant size. The chassis to which these components are attached is usually mounted in a separate housing which protects the circuit components from external elements. The assembly of the various electrical components on the chassis is such an arrangement; it usually requires many specific manual labor operations such as locating and aligning the various components and securing them to the chassis. This construction arrangement is time-and labor-consuming.

BRIEF SUMMARY OF THE INVENTION

The difficulties in assembly may be readily alleviated by construction of a chassis which permits a mere drop in of electrical components into preformed receptacle means combined with a unitary clamping arrangement to simultaneously secure all the individual electrical components in place.

Therefore, in accord with the principles of the invention, a circuit support enclosure has drop-in receptacles for the individual circuit components of a power supply circuit in a supporting base chassis structure. Once the components of the circuit are dropped in place and wired, a retaining chassis structure is mated with the supporting chassis structure. One of the chassis structures includes two tongs including pawls which interlock with slots in the other mating chassis structure. The retaining chassis structure includes bifurcated tines and clamp nodules that secure and clamp the components into their respective drop-in receptacles in the base chassis structure.

Another feature of the invention is a clamping arrangement to lock the power outlet cord to a fixed position at or near the exit point from the circuit support enclosure to prevent application of cord tension to internal wiring via transmission of tension through the power cord.

BRIEF DESCRIPTION OF THE DRAWINGS

An understanding of the principles of the invention may be readily attained by reference to the following specification and the accompanying drawings in which.

DETAILED DESCRIPTION

Figure 1:
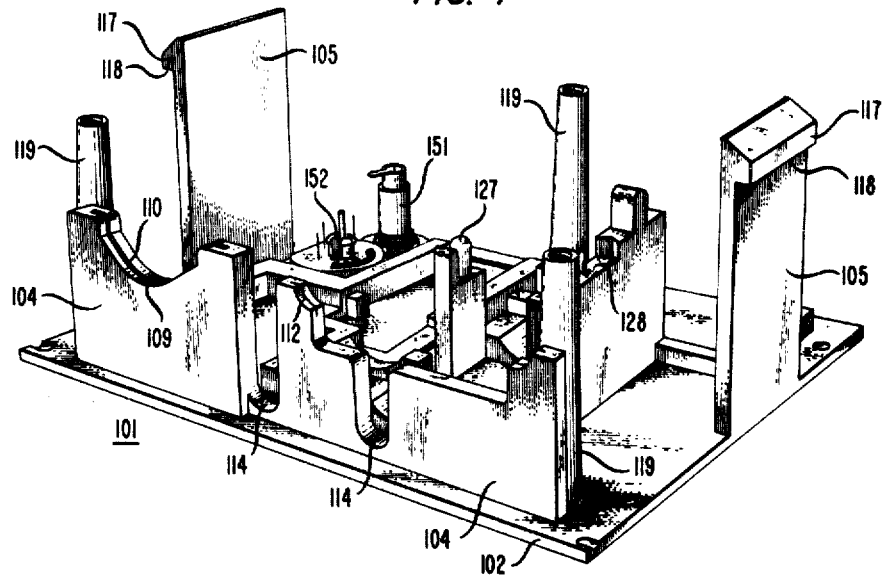
FIG. 1 is an axonometric view of a base chassis structure for a power supply utilizing the principles of the invention.
Figure 2:
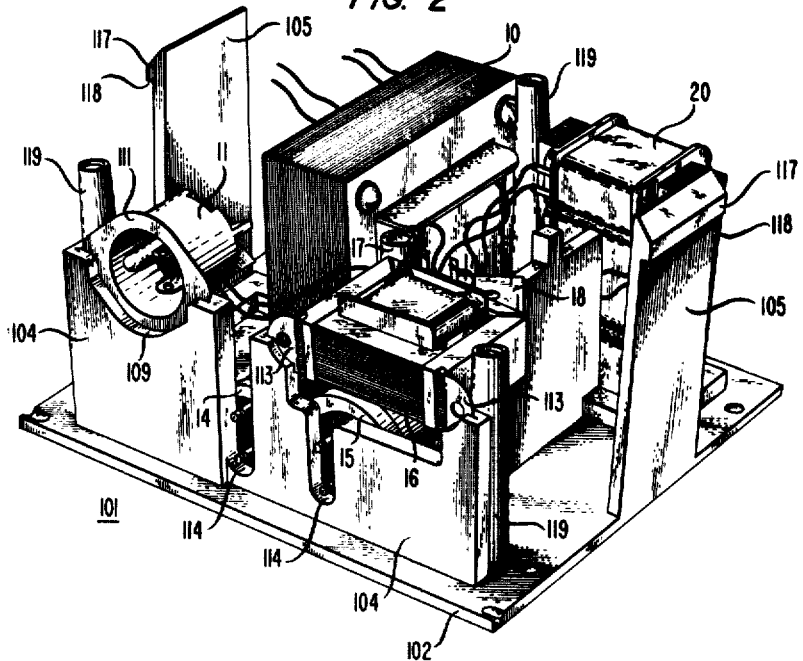
FIG. 2 is an axonometric view of the same base chassis structure of FIG. 1 showing electrical components inserted into the structure.
Figure 3:
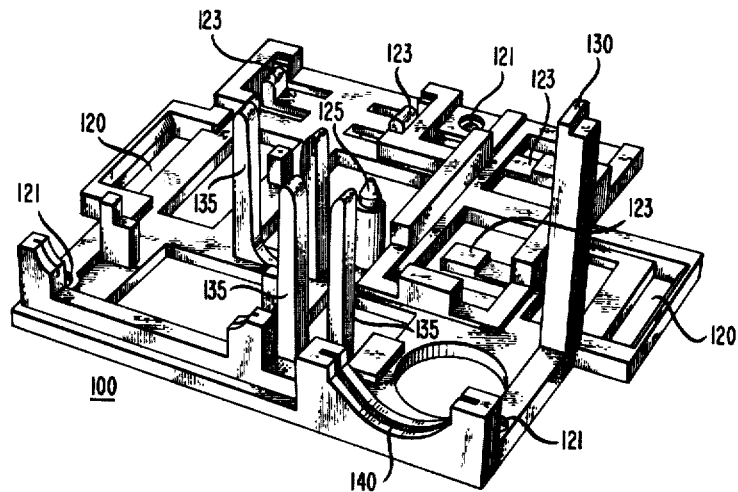
FIG. 3 is an axonometric view of a retaining chassis structure utilizing the principles of the invention.
Figure 4:
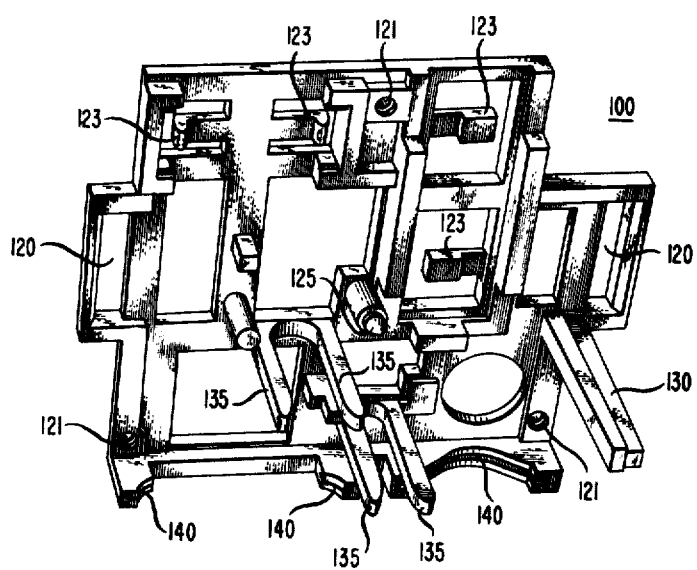
FIG. 4 is another axonometric view of the retaining chassis structure shown in FIG. 3.
Figure 5:
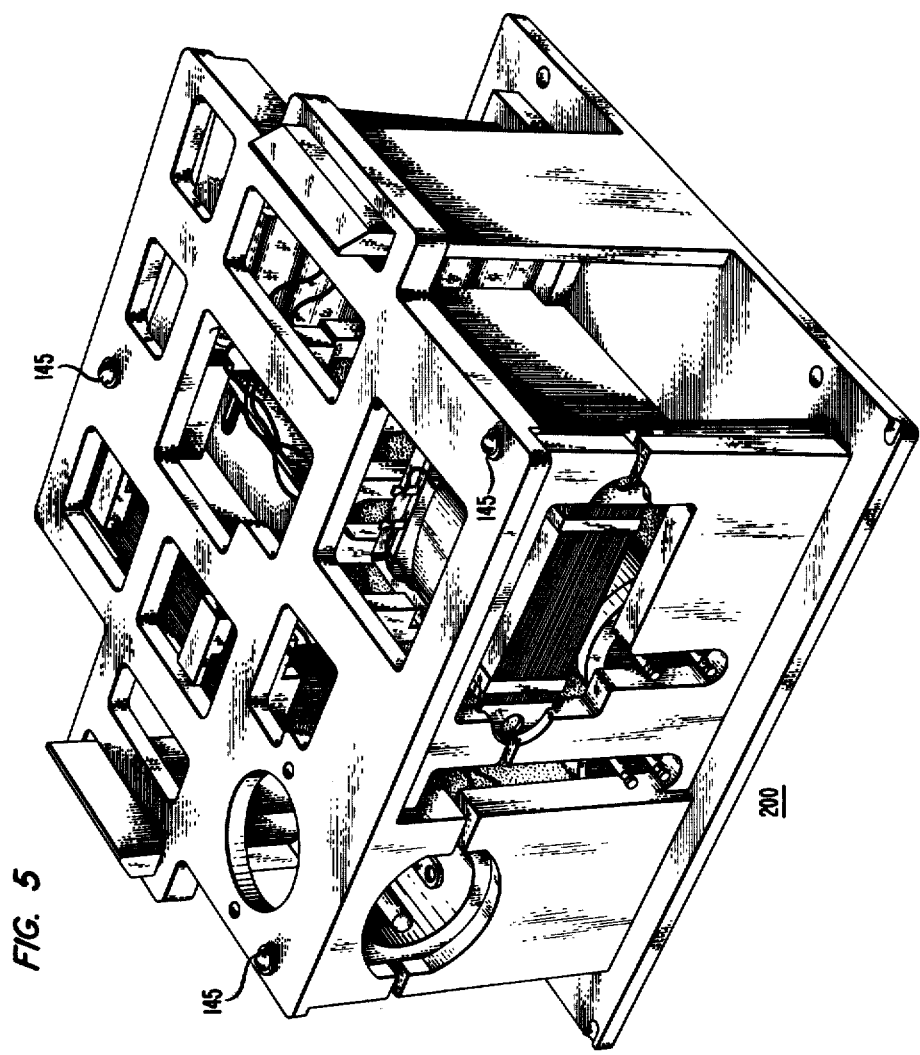
FIG. 5 is an axonometric view of the complete circuit support enclosure with the electrical components contained therein.
Figure 7:
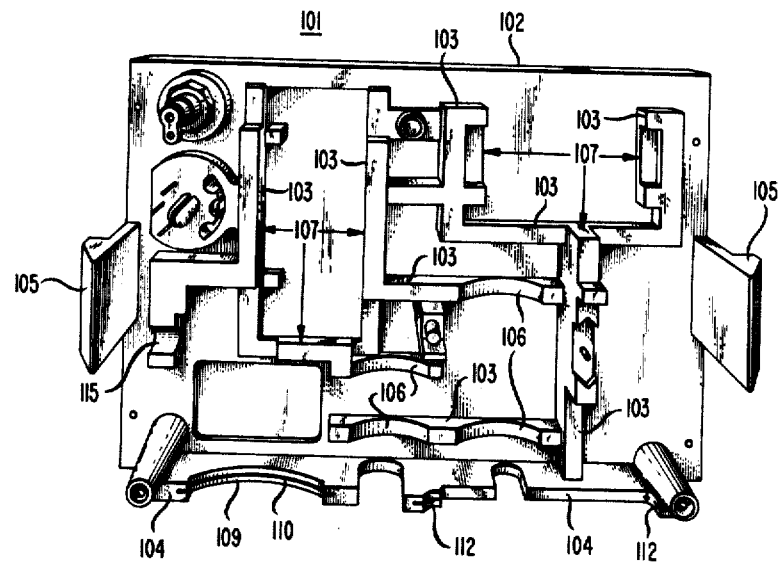
FIG. 7 is another axonometric view of the base chassis structure.

A circuit support enclosure embodying the principles of the invention includes two separate mating structures, a base chassis structure as shown in FIGS. 1, 2 and 7 and a retaining chassis structure as shown in FIGS. 3 and 4. These two structures interlock as shown in FIG. 5 to secure the electrical components of a power supply firmly into place.

The circuit support enclosure may be made of a structural foam material, such as polycarbonates, permitting its manufacture by molding techniques. Details of the materials and the manufacturing method are wellknown to those skilled in the plastics art and need not be disclosed herein in detail.

FIGS. 1, 2 and 7, representing three separate views, are considered together in describing the base chassis structure. Reference numerals applied to various structural elements are identical in each of these three views. The base chassis structure 101, as shown in FIGS. 1, 2 and 7, includes a plurality of drop-in receptacles to accept the electrical components of the power supply to be contained by the circuit support enclosure. The geometry of each of the individual receptacles is defined by the nature of the individual components they are designed to accept. A face plate 102 includes structural ribs 103 (FIG. 7) which are suitably intended, as needed, to allow the supported electrical component to drop fit into the base chassis structure. The base chassis structure 101 further includes supporting walls 104 and interlocking tongue means 105 attached to face plate 102.

Figure 8:
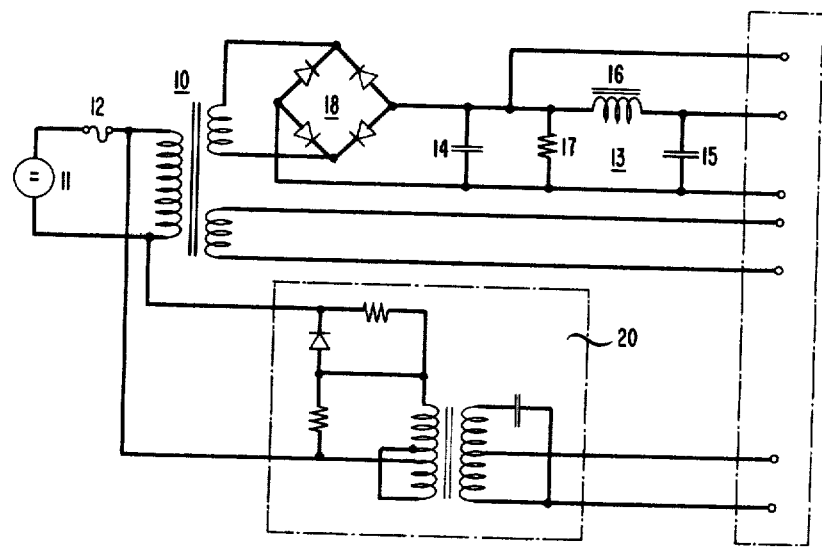
FIG. 8 is a circuit schematic of a particular power supply circuit supported by the circuit support enclosure disclosed herein.

In the particular example herein, the electrical circuit supported by the chassis enclosure is schematically shown in FIG. 8. It includes a main power transformer 10, an AC input connector 11, and an AC fuse 12 between the connector and the power transformer. A filter circuit 13 includes filter capacitors 14 and 15, filter inductor 16 and a bleeder resistor 17. A solid-state bridge rectifier 18 is interposed between the power transformer 10 and the filter 13. Also connected to the input terminal of the AC input connector 11 is a frequency generator unit 20 which is a prefabricated unit and includes diodes, resistors, capacitors and a saturating transformer structure. It is operative to generate subharmonic signal frequencies.

These particular electrical components are pictorially shown as positioned into the base chassis structure in FIG. 2. The various structural arrangements of the supporting ribs 103 prevent lateral motion of the electrical components after they are dropped into place on the backside of the face plate 102. Circular surface indents 106 in the ribs 103 provide bearing surfaces which conform to a cylindrical shape of certain components such as the can-type filter capacitors 14 and 15. The ribs further are designed to provide strictly dimensioned rectangular enclosures 107 into which flat structural bearing surfaces of the main power transformer 10 and the frequency generator 20 are fitted. The rectangular enclosures defined by the rib structure are designed to prevent lateral sliding motion of these particular components. Part of the rib structure also contains a support post 127 onto which a bleeder resistor 17, structured as a hollow cylinder, may be dropped.

Along one edge of the face plate structure 102 is a wall-like arrangement 104 which has a curved detent 109 dimensioned to conform to the outer curved surface of an AC input connector structure 11. Along the center of this curve detent, a slot 110 is cut. A flange 111 of the AC input connector 11 fits into this slot. Immediately to the right, the wall 104 is configured rectangularly and includes slot 112 into which the flange 113 of the filter inductor 16 drops. U-shaped detents 114 in this wall permit the terminals of the can capacitors resting in detents 106 to protrude through. The use of slots to accept component flanges readily secures these components into place without the necessity of positioning and screwing them onto a chassis or providing a carefully dimensioned receptacle having a complex contour conforming to the complex discontinuous contours of the components.

Figure 6:
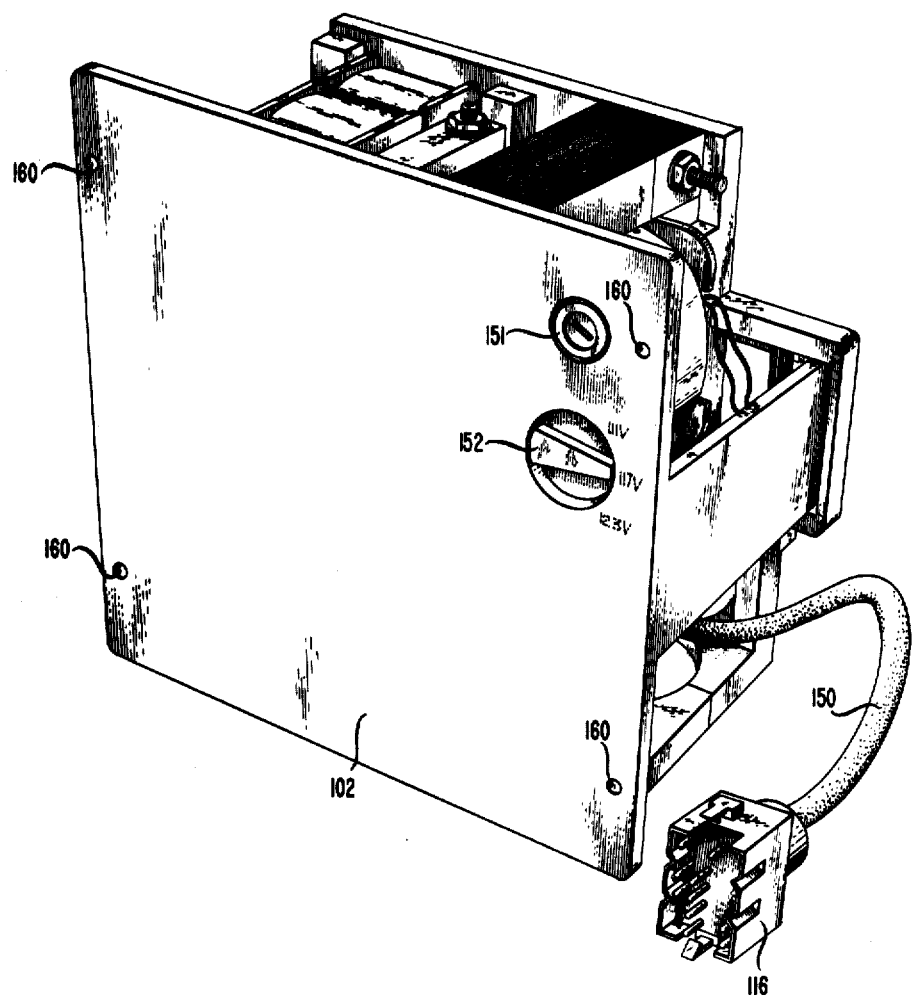
FIG. 6 is an axonometric view of the external face plate of the base chassis structure.

A power output cord is passed through a defile 115 in the rib and from thence to the DC output plug 116 (FIG. 6). As described below, the power cord is firmly clamped in place at the defile 115 to eliminate application of tension to the internal wiring through the cord. At each end of the base chassis structure 101 and molded to the face plate 102 is a tong 105, each having a pawl 117, with a lip 118 which is used to engage corresponding slots 120 (FIGS. 4 and 5) in the mating retaining chassis structure 100 which is used in combination with the base chassis structure to clamp the electrical components into place as shown in FIG. 5.

The base chassis structure shown in FIGS. 1, 2 and 7 further includes three pillar structures 119 fastened to the face plate 102. These pillar structures 119 have a carefully dimensioned height from the face plate 102 so that their top surfaces rest against bearing pads 121 (FIGS. 4 and 5), included in the retaining chassis structure portion of the circuit support enclosure, and are operative to maintain a precise distance between the face plate and the face plate web structure of the retaining chassis structure so that the clamping arrangements firmly support the electrical components in their designated receptacles without applying undue pressure thereto and further to insure that the interlocking mechanism, namely, the lips 118 of the pawls 117, interlocks with the right amount of pressure with the open slots 120 of the retaining chassis structure.

The retaining chassis structure 100 includes clamp nodules 123 which are adapted to apply just enough pressure to the magnetic component surface to secure it firmly on the backside of the face plate 102 of the base chassis structure 101. For electrical components that are not clamped to this surface, it includes bifurcated retainers 135 to secure such components as the can-type capacitor. A prong 125 secures a bleeder resistor component 17 (FIG. 2) onto a corresponding prong 127 on the base chassis structure.

Bearing surfaces 121 are designed to fit against the pillars 119 of the base chassis structure and maintain precise distance between them to contain the components with proper clamping pressure. A cord clamping post 130 (FIGS. 3 and 4) firmly affixes the cord into the cord defile 115 (FIG. 7) in the base chassis structure 101 to prevent tension on the internal wiring of the power supply due to tension on the power cord. Likewise, notches 140 (FIGS. 3 and 4) are provided to grasp the flanges of components fitted into corresponding notches in the base chassis structure 101. The clamping nodules 123 are used, in particular, to support or hold the frequency generator and the power transformer within their respective rectangular enclosure.

Bifurcated retainers 135 (FIGS. 3 and 4) hold the two can-type capacitors 14 and 15 in place. At either end of the web plane structure of the retaining chassis structure are extensions providing notches or slots 120 which engage with the pawls 117 of the tongs 105 which interlock the base chassis structure and the retaining chassis structure together.

To assemble the power supply within the chassis, the components are merely dropped into place, as shown in FIG. 2, which means positioning the power transformer 10 and the frequency generator 20 so that one of its flat surfaces fits in the rectangular enclosure 107 (FIG. 7) defining its position. The can-type capacitors 14 and 15 are fitted into the cylindrical detents 106 (FIG. 7). The filter inductor 16 and power input connector 11 have their flanges fitted into the slots 110 and 112, respectively. Resistor 17 is placed on post 127 and bridge rectifier 18 is placed in recess 128 (FIG. 1). The components may be wired together before or subsequent to this drop-in operation. The retaining chassis structure is placed into position above the base chassis structure, and the two are connected together by allowing the pawls of the tongs to slide into the slots until the lips of the pawls engage the edges of the slots, as shown in FIG. 5, where a completely assembled power supply chassis 200 is shown.

As shown in FIG. 5, a safety precaution may be the use of screws 145 which go through the bearing pads 121 and engage threaded holes in the pillars 119 which determine the dimensional distance between the base chassis structure and the retaining chassis structure. While screw connections are shown herein to further secure the base chassis structure and the retaining chassis structure together, it is to be understood that this constitutes merely a safety precaution. It is not essential to the operation of the circuit support enclosure and, if desired, the screw connections may be eliminated without detriment to the functioning of the circuit support enclosure.

A front view of the circuit support enclosure, shown in FIG. 6, shows the front side of the face plate 102 which is the exposed portion when the entire circuit support enclosure is fitted into the overall circuit housing or chassis. Shown on the face plate is the fuse arrangement 151 which allows the insertion and extraction of a fuse and a dial arrangement 152 which permits the selection or adjustment of the power supply circuit to varied applied input voltages. The output power plug 116, which is shown extended to the right, is connected internally to some other equipment in the overall housing to be powered by the particular power supply.

Screw holes 160 are provided to permit the fastening of the face plate to the main overall housing system.

While the circuit support enclosure has been disclosed with reference to supplying a chassis for a particular circuit schematic shown in FIG. 8, it is readily apparent that various other arrangements and uses of the techniques disclosed herein may be readily applied to other circuit schematics to provide a circuit support enclosure without departing from the spirit and scope of the invention.

I claim:

1. An enclosure-type circuit support structure to support electrical components of a circuit including resistive and reactive devices, the circuit support structure comprising:

a base chassis structure and a retaining chassis structure joined together by interlocking apparatus which locks the two chassis structures together in order to secure the electrical components in place, the base chassis structure including a plurality of drop-in receptacles each adapted dimensionally for receiving a specific electrical component of the circuit to be supported including at least a receptacle for a reactive device, the electrical components of the circuit being inserted into the receptacles;

the retaining chassis structure including retaining means for applying a constraining force to the electrical components in order to secure the electrical components into assigned drop-in receptacles; and the retaining means comprising at least a clamp nodule applying clamping pressure to at least a selected reactive device of said electrical components, the clamp nodule comprising a projecting member set in an aperture in the retaining chassis structure which is aligned with a drop-in receptacle in which the selected electrical component is situated, the projecting member being connected as a cantilever-type beam to a periphery of the aperture and including a protuberance at a free end of the projecting member, the protuberance applying clamping pressure to the selected electrical component to hold it in its drop-in receptacle.

2. An enclosure-type circuit support structure as defined in claim 1 further including pillar support means in the base chassis structure mating with pad means in the retaining chassis structure in order to maintain a specific linear dimension between the base chassis structure and the retaining chassis structure.

3. An enclosure-type circuit support structure as defined in claim 1 wherein the base chassis structure includes a defile through which passes a flexible power cord from at least one circuit component to outside the circuit support structure and post-type securing means in the retaining chassis structure mating with the defile and dimensioned so as to apply pressure to the cord and firmly clamping the power cord between the defile and an end of the pillar in order to prevent application of tension through the power cord to the electrical components contained within the circuit support structure.

4. An enclosure-type circuit support structure as defined in claim 3 wherein said retaining means further includes walls with slots into which flanges of electrical components are inserted, said slots being included in both the base chassis structure and the retaining chassis structure, and positioned for engaging the flanges and engaging and holding in position selected electrical components.

* * * * *